United States Patent [19]
Bristol et al.

[11] Patent Number: 4,782,285
[45] Date of Patent: Nov. 1, 1988

[54] VARIABLE RESOLUTION CONTROL SYSTEM

[75] Inventors: Lloyd R. Bristol, Tigard; Alfred K. Hillman, Portland, both of Oreg.

[73] Assignee: Tektronix, Inc., Beaverton, Oreg.

[21] Appl. No.: 112,019

[22] Filed: Oct. 19, 1987

Related U.S. Application Data

[63] Continuation of Ser. No. 928,602, Nov. 3, 1986, abandoned, which is a continuation of Ser. No. 576,296, Feb. 2, 1984, abandoned.

[51] Int. Cl.⁴ .................. G01R 17/02; G01R 15/10; H04B 1/64
[52] U.S. Cl. .................................. 324/98; 324/132; 328/142; 333/14
[58] Field of Search ............ 324/98, 121 R, 115, 324/132; 318/591, 592; 330/129; 328/142, 145; 333/14; 307/490, 493

[56] References Cited

U.S. PATENT DOCUMENTS

| | | | |
|---|---|---|---|
| 1,986,644 | 1/1935 | Pfister | 333/14 |
| 2,216,454 | 10/1940 | Pfister | 333/14 |
| 3,943,466 | 3/1976 | Lyghounis | 333/14 |
| 4,035,739 | 7/1977 | Dickopp et al. | 330/129 |
| 4,333,056 | 6/1982 | Cave | 330/129 |
| 4,353,019 | 10/1982 | Sweeney, Jr. | 318/592 |
| 4,562,591 | 12/1985 | Stikvoort | 333/14 |

Primary Examiner—Ernest F. Karlsen
Attorney, Agent, or Firm—John P. Dellett; George T. Noe; Francis I. Gray

[57] ABSTRACT

A variable resolution system for a potentiometer converts the analog output of the potentiometer to digital steps which are multiplied to provide a number of digital output steps dependent upon the extent of potentiometer movement since last reversal. Upon each reversal, the number of output steps per input step is reduced to provide greater resolution.

11 Claims, 4 Drawing Sheets

VARIABLE RESOLUTION CONTROL SYSTEM

This is a continuation of application Ser. No. 928,602, filed 11/3/86, now abandoned, which is a continuation of application Ser. No. 576,296, filed 2/2/84, now abandoned.

BACKGROUND OF THE INVENTION

The present invention relates to an instrument control system and more particularly to an instrument control system having a high degree of settable precision.

Ordinary manually operated controls such as rotatable potentiometers and the like tend to be limited in output resolution, i.e. in the number of steps of output settability which can be controlled for a given angle of rotation. While expensive vernier devices and mechanical backlash or multi-turn potentiometers are available, the use of standard potentiometers is economically advantageous. A plurality of controls can be provided for manipulating the same variable with varying degrees of precision. However, this again adds to expense as well as to a proliferation of instrument knobs and is somewhat confusing to operate. It would be of advantage to provide an adaptive control device which automatically provides an optimal degree of precision.

SUMMARY OF THE INVENTION

In accordance with the method and apparatus of the present invention, the output of a given control device, such as a potentiometer having a given range of adjustment, is converted to an output having an effectively larger range of adjustment having greater resolution beyond the capability of the original control range. For limited incremental movement of the control device, the output increments by small steps of exhibiting fine resolution. However, as the control device is physically displaced in a consistent direction over a more extended interval, the resolution becomes coarse and a somewhat greater incremental change in output is produced for a given increment in input movement. If the physical movement of the control device in a given direction is halted, and the operator begins turning the control device in the opposite direction, then the output returns to the original precision of supplying a small output increment for each input incre until physical displacement in the second direction is extended, whereupon change is made to the coarser resolution. Thus, the operator can move the desired variable over a large range and then move the control back and forth with fine resolution to "zero in" on the desired value.

In the preferred embodiment, a physical displacement of the control continues in a given direction, the degree of resolution coarseness or the degree of output change compared to input change will increase, over a series of steps, until the output moves comparatively rapidly with input change.

Also in a preferred embodiment of the present invention, the input control device, such as a potentiometer, provides its output to an analog to digital converter that converts the analog setting to a plurality of digital level numbers. These numbers are converted to a larger range of output level numbers in a processor wherein multiplication of the number of input steps to provide the number of output steps is variable. In particular, the input step, at which the last change in directional movement of the control occurs, is remembered, and the farther the control device moves in a given direction from the last change in direction, the greater the multiplication of the number of output steps compared with the number of input steps.

If the input control device is not continuously variable but has stops, a detection is made when the remaining adjustment in the control device is insufficient to cover the range of output remaining of the predetermined number of output steps produced by the processor. If the input range is insufficient, the output is incremented in a direction for reducing the remainder of the larger range. The output function is forced to approach a limit value at a maximum output increment rate when the input device approaches a limit, whereby the output function reaches its limit by the time the input device reaches its limit.

It is accordingly an object of the present invention to provide an improved variable resolution control method and apparatus.

It is a further object of the present invention to provide improved precision from a somewhat inexpensive control device.

It is a further object of the present invention to provide a controlled degree of precision and a controlled degree of output variation from a physically movable control device.

The subject matter which we regard as our invention is particularly pointed out and distinctly claimed in the concluding portion of this specification. The invention, however, both as to organization and method of operation, together with further advantages and objects thereof, may best be understood by reference to the following description taken in connection with the accompanying drawings wherein like reference characters refer to like elements.

DRAWINGS

FIG. 1 is a block diagram of a variable resolution control system according to the present invention, FIG. 2 is a graph plotting the output increment size, for the FIG. 1 system, versus the number of input steps of increments, FIGS. 3a and 3b is a flow-chart illustrating the program of operating the processor of the FIG. 1 system, and FIG. 4 is a block diagram of an alternative embodiment of the system according to the present invention.

DETAILED DESCRIPTION

Figure 1:
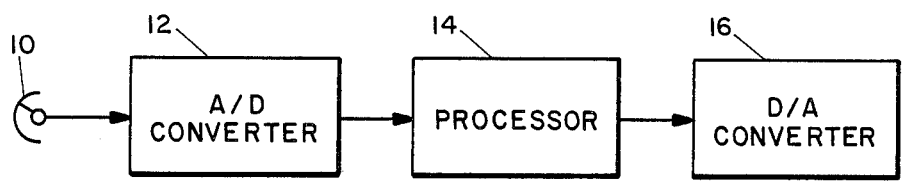

Referring to the drawings and particularly FIG. 1, a rotatable manual control device 10, such as a potentiometer, provides its output to analog to digital converter 12 wherein the analog output of control device 10 is converted into a multiplicity of digitally defined levels, for example 256 different levels in the case of a specific embodiment. Each level is represented by a separate code or number, e.g. the numbers 0 through 255. The output of analog to digital converter 12 is applied to processor 14, the purpose of which is to variably expand the number of levels provided at the output of analog to digital converter 12. The output of processor 14 is in turn applied to digital to analog converter 16 the purpose of which is to convert a given level-representing-number, supplied from processor 14, into an analog output for use by further circuitry.

As mentioned above, the processor 14 expands the number of levels produced by converter 12 into a larger number of levels. Typically, A/D converter 12 supplies 256 codes, while processor 14 may produce 4,096 codes representing sixteen times as many levels at an input to D/A converter 16. Therefore, it can be said the output has an effectively larger range of adjustment than the input or is capable of a larger magnitude output coverage and a finer resolution control than the input. In order to make use of this resolution capability, the processor changes its output by one "step" for each input "step", so long as the input control device 10 is rotated to a limited extent in a given rotational direction since its last reversal. If, on the other hand, the operator rotates control device 10 by a large amount in a given direction, then processor 14 will provide several output "steps" for each input "step". At this time, a coarse-resolution effect is produced. If the operator overshoots the desired setting, and reverses the direction of rotation of control device 10, the magnitude of output change for input change becomes small again to provide fine resolution control. As long as rotational movement is limited, e.g. back and forth around the desired value, fine resolution is maintained until the operator once again sweeps control device 10 by a large amount in a consistent direction. Therefore, the operator has the advantage of being able to make large changes in the output of D/A converter 16, and then "zero in" to a vernier mode of operation when the exact output desired is closely approached.

Figure 2:
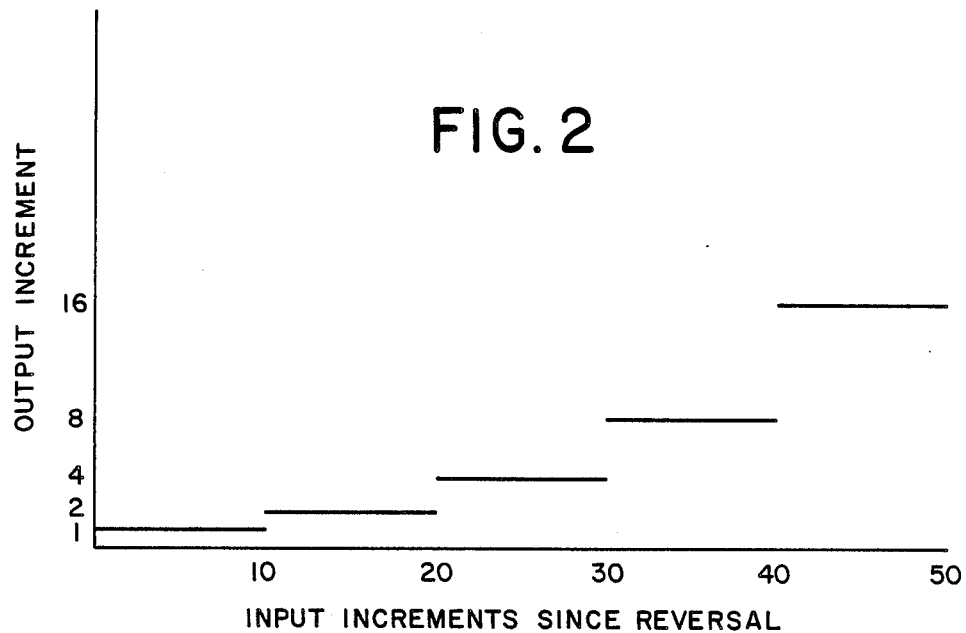

The operation is graphically depicted in FIG. 2 wherein output increments are plotted against input increments since the last reversal of control device 10. In the particular example, ten input increments are chosen as a "doubling interval" and if the output of A/D converter 12 changes by ten steps in a consistent direction, then processor 14 doubles the effect of each input increment so that each input increment will produce two output increments rather than one. This condition is maintained as long as control device 10 is not moved by more than twenty steps in the same direction. If it is, processor 14 supplies four output steps for each input step, and so on, until the control device 10 has produced forty or more input steps whereby sixteen output seps will be provided to D/A converter 16 for each input step. As stated above, if the direction of rotation of control 10 is reversed, the processor 14 reverts to supplying one output step for each input step until movement of more than ten input steps in a second direction occurs.

In a particular embodiment, processor 14 comprises a type 6802 microprocessor manufactured by Motorola and D/A converter was a type AMD 6012. A/D converter 12 comprises a conventional circuit also including an AMD 6012 D/A converter and a comparator for determining when the D/A converter produces an analog output matching the output of control device 10.

In addition to the variable range and variable resolution feature outlined above, the system according to the present invention provides an end control for the situation when control device 10 approaches the end of its range, assuming control device 10 cannot be rotated continuously. If control device 10 has a limited range of movement, a point will be reached such that the operator will be approaching the end limit of the control device faster than the output of D/A converter 16 is approaching the end of its total of 4,096 steps in the given example. As will be more fully explained below, when this end-approaching condition is encountered, the output from D/A converter 16 is caused to step by larger steps whereby it will reach the end of its range when control device 10 reaches the end of its range.

Figure 3A:
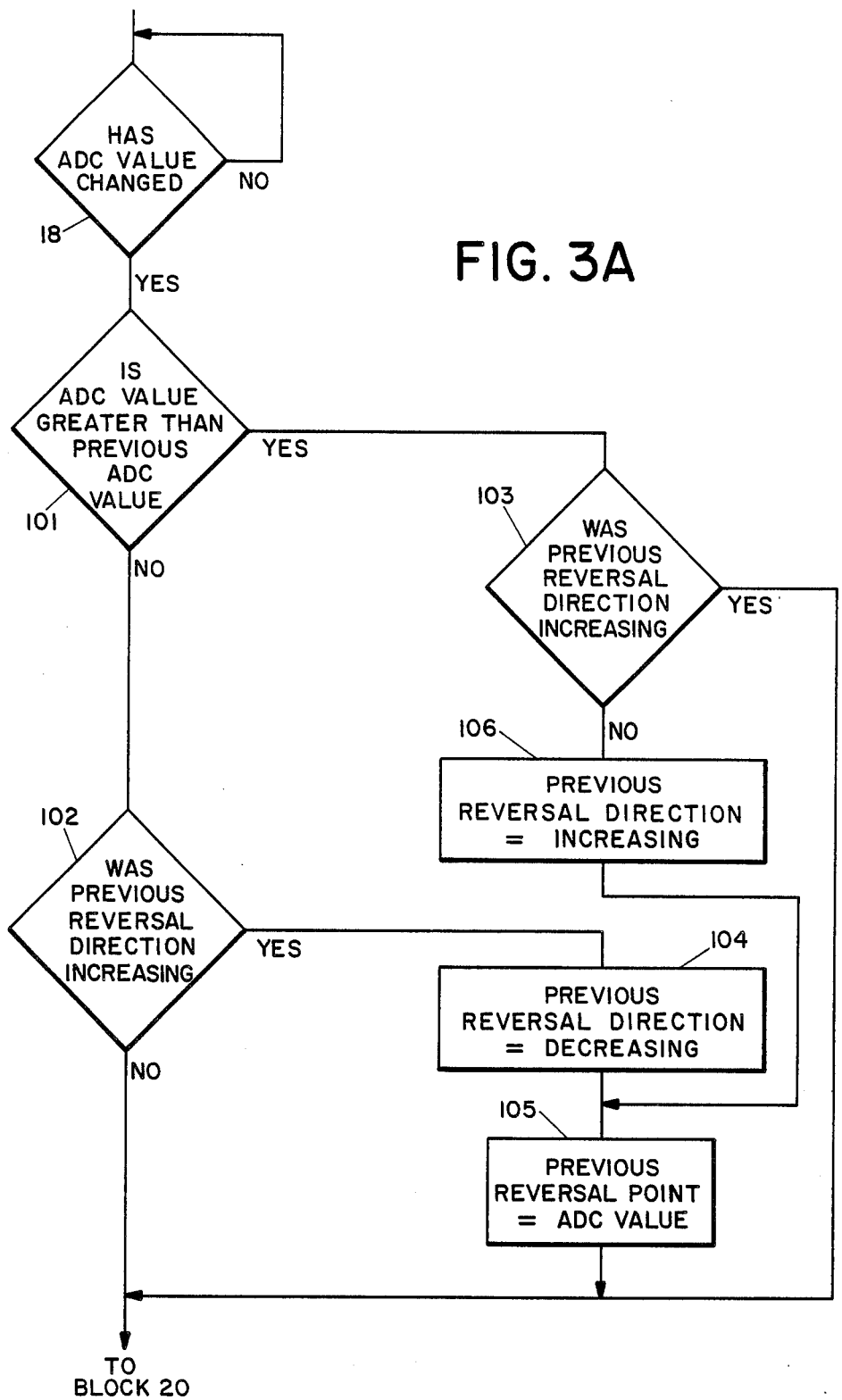

Referring to FIG. 3, comprising a flow chart describing the operating program for processor 14, decision block 18 in FIG. 3a determines whether the ADC (analog to digital converter) 12 has produced a change in output value, indicating the control device 10 has changed in position. For this purpose, processor 14 constantly keeps track of or stores the previous value of the setting of control device 10, and if there has been a change, then decision block 18 produces a YES output. Otherwise, decision block 18 continues to ask whether a change has taken place.

When the ADC value changes, decision block 101 asks whether the ADC value is greater than the previous ADC value. If the answer is NO, the program proceeds to decision block 102 which determines whether the previous reversal direction (i.e., the direction of ADC change at the last reversal) was "increasing". If it was not, then the program proceeds to decision block 20 in FIG. 3b, inasmuch as it appears the new ADC value must be less than the previous ADC value, this being consistent with a "decreasing" movement since the last reversal. Also, if the YES output is produced at decision block 101, then the program proceeds to decision block 103 which asks whether the previous reversal direction (the direction of ADC change at the last reversal) was "increasing". If the answer is YES, then it would appear the ADC output is continuing to increase and the program will again proceed to block 20 in FIG. 3b.

On the other hand, if a YES output is produced by decision block 102, then the ADC output will have changed in direction and the "previous reversal direction" is changed to "decreasing" by assertion block 104. Block 105 then sets the "previous reversal point", that is the ADC value at which reversal has taken place, to be equal to the current ADC value. Return is then made to block 20. Similarly, if the output of decision block 103 is NO, then the ADC output has changed in direction from "decreasing" to "increasing", and the "previous reversal direction" is set to "increasing" by block 106. From block 106, the program goes to block 105 where the previous reversal point or the ADC value at which reversal has taken place is set to the current ADC value.

Figure 3B:
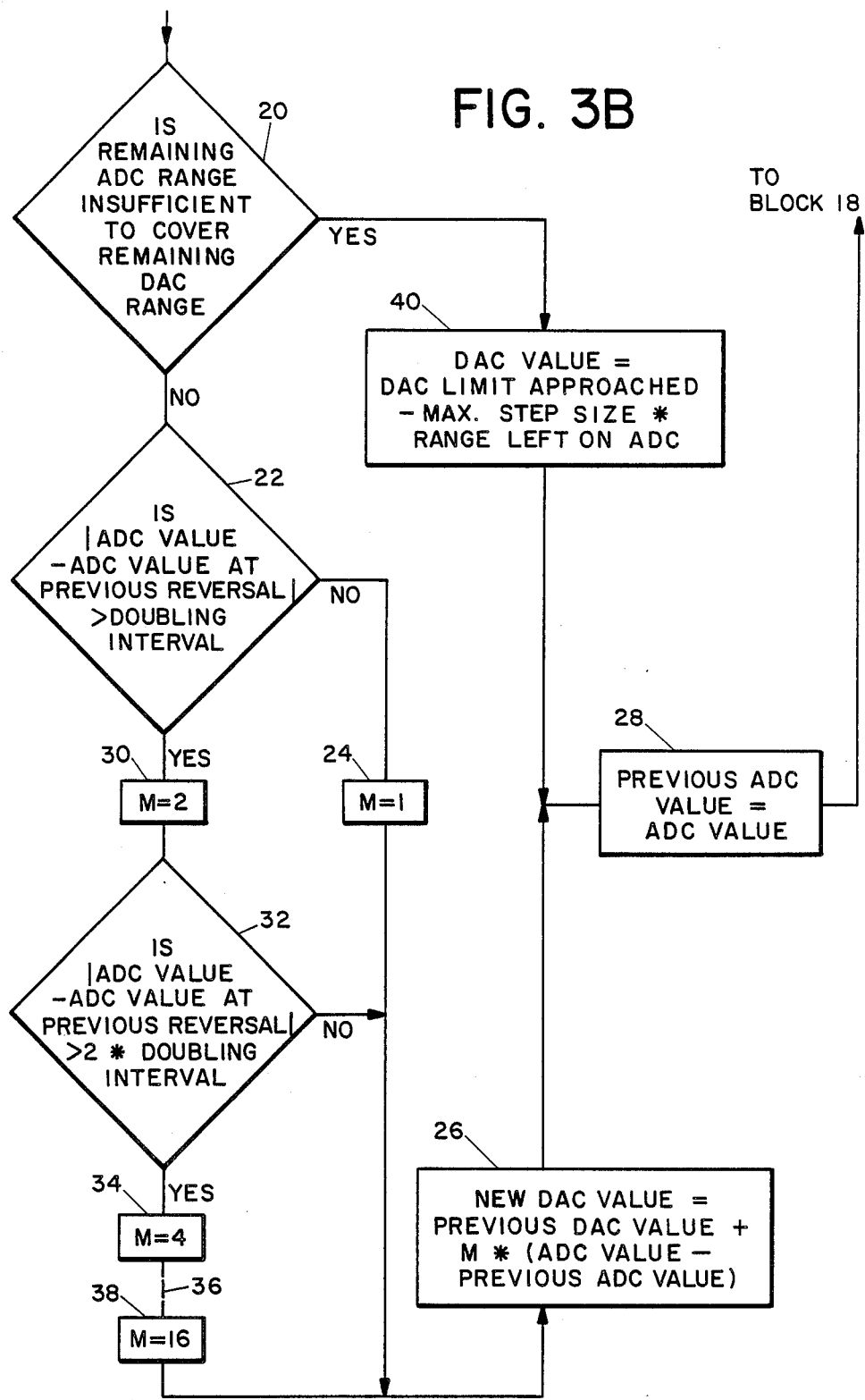

When the previous reversal point has been determined, as outlined in the flow chart of FIG. 3a, the program proceeds to the flow chart of FIG. 3b where decision block 20 asks whether the remaining ADC range is insufficient to cover the remaining DAC (digital to analog converter) range of converter 16. Assuming the control device 10 is near the middle of its overall range and not near one end, then a NO output from decision block 20 will result in entrance into decision block 22 which determines whether the absolute value of the ADC output minus the ADC output at the last previous reversal is greater than the doubling interval. In the present example, the doubling interval is ten steps, so the question is whether the analog to digital converter 12 has produced ten steps since the last reversal of control device 10. If a change of ten steps has not taken place, then M is set equal to 1 in block 24, and the program falls through to program block 26 wherein the new DAC value (the input of converter 16) is set equal to the previous DAC value plus M multiplied by (ADC value−previous ADC value). Assuming the processor 14 can keep up with rotation of control device 10, then the quantity (ADC value−previous ADC value) is equal to one, that is, one step. The new DAC value then becomes the previous DAC value plus one, inasmuch as M is equal to one. Then, the previous ADC value is set equal to ADC value in block 28 and return is made to decision block 18 in FIG. 3a.

If a YES output was produced by decision block 22, indicating that the doubling interval (equal to ten in this example) was exceeded, then M is set equal to two in block 30. Decision block 32 then asks whether the absolute value of ADC value−ADC value at the previous reversal is greater than twice the doubling interval. If it is not, the NO output causes the program to proceed to block 26, with M equal to two. Consequently, the new DAC value is set equal to the previous DAC plus two, assuming the control device 10 has not moved more than one step. On the other hand, if the output of decision block 32 was YES, and two doubling intervals had been exceeded, then M would be set equal to four in block 34. As indicated by a dashed line at 36 in FIG. 3, this procedure continues with decision blocks similar to blocks 22 and 32 whereby M may be set to eight and sixteen as can also be seen in FIG. 2. Thus if the change in ADC value is greater than three times the doubling interval, then M is set equal to eight. If the change in ADC value is greater than four times the doubling interval, then M is set to equal to sixteen.

Returning to decision block 20, if a YES output is produced, indicating the remaining ADC range is insufficient to cover the remaining DAC range, then block 40 is entered and the DAC value (the value input to converter 16) is set equal to the DAC limit approached−the maximum step size multiplied by the range left on the ADC. The maximum step size is in the present example is set equal to thirty-two, that is twice the otherwise maximum value of M which was sixteen. It will be observed that the maximum number of steps input to converter 16 is sixteen times the number of steps output from converter 12. I.e., 4,096=16×256. Consequently, the maximum step size of thirty-two is adequate for bridging the gap to the end of the DAC range when the ADC approaches the end of its range.

The question asked in decision block 20 is more fuly described as follows: Is |maximum step size multiplied by the range left on ADC|<|DAC limit approached−present DAC value|. If the answer is yes, then the new DAC value is set by block 40 such that the |maximum step size multiplied by the range left on ADC|=|DAC limit approached−new DAC value|. In other words, the new DAC value is set equal to the DAC limit approached−maximum step size multiplied by the range left on ADC.

After block 40, block 28 is entered and the previous ADC value is set equal to ADC value and return is made to decision block 18. If the end of the ADC (that is the end of the control device 10) is being approached, faster than the end of DAC is being approached, return will again be made to block 40, and the DAC will step at thirty-two DAC steps per ADC step so as to provide a proper correlation between the input and output at the end of the ADC range. The new DAC value is forced to a value that will allow proper registration at the end of the ADC range.

Of course, if control device 10 does not have an end of range, but is rather a continuous device such as a 360 degree potentiometer, then the considerations of block 20 and 40 in the FIG. 3b flow chart are unnecessary and the program falls through to decision block 22.

Appended hereto is a code listing corresponding to typical operation according to the flow chart of FIG. 3.

Figure 4:
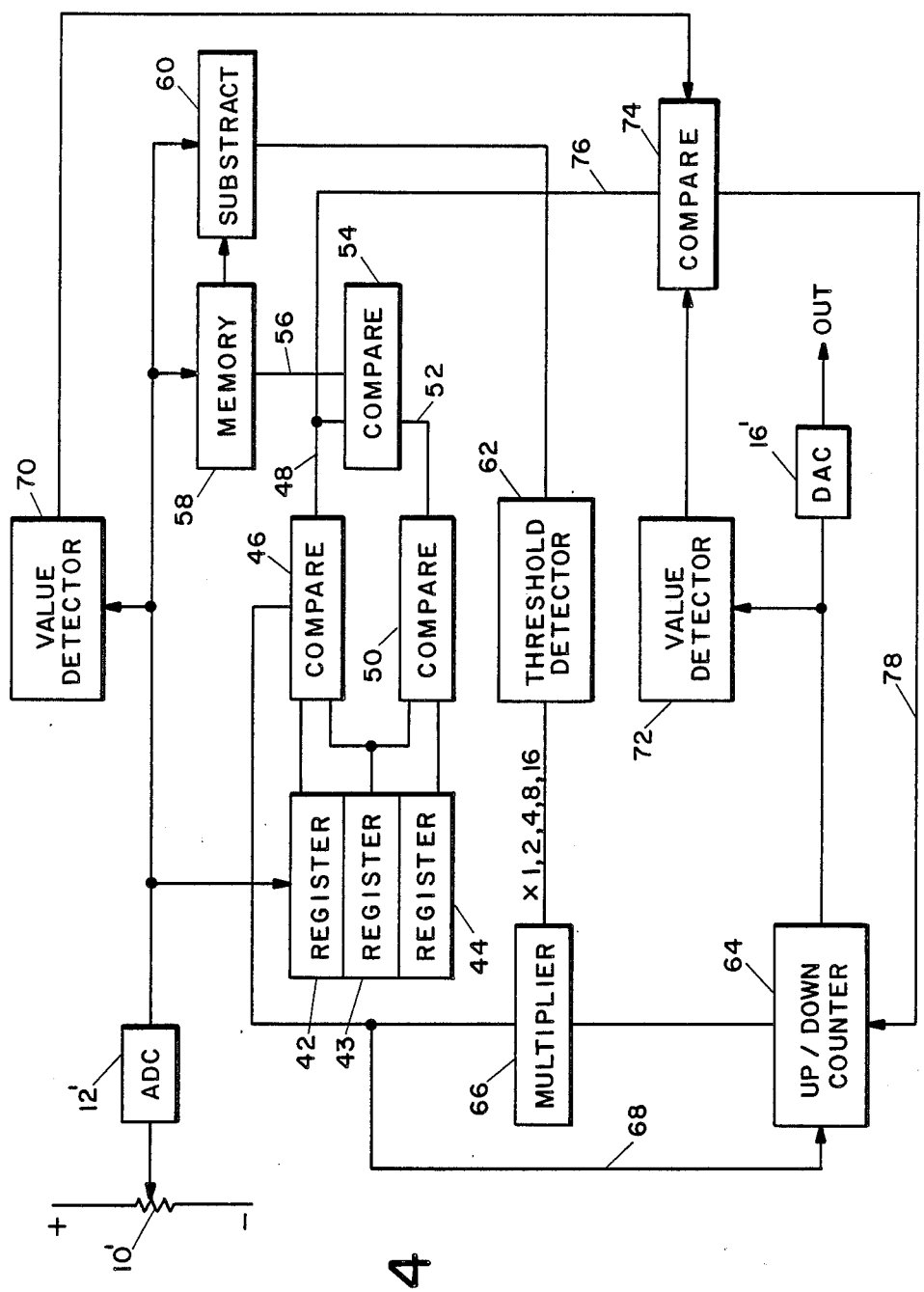

A hardware version of the present invention is illustrated in the FIG. 4, wherein processor 14 is implemented in hard-wired computer circuitry. Again, control device 10′, here comprising a potentiometer, applies the input to analog to digital converter 12′. The output of converter 12′, comprising a digital number representing the analog level of the potentiometer, is supplied to a stack of registers, 42, 43, 44, wherein the output of ADC 12′ is first entered into register 42, and then successively into registers 43 and 44, each time the numerical output of ADC 12′ changes by one step. Successive outputs of ADC 12′ are entered such that register 44 will contain the output of ADC 12′ three changes ago, register 43 will contain the output of ADC 12′ two changes ago, and register 42 will contain the output of ADC 12′ at the last change. Registers 42, 43, 44 thus provide a history of outputs of ADC 12′ and are employed to indicate whether the ADC output has reversed in direction.

The output of registers 42 and 43 are compared, i.e. subtracted in comparison circuit 46, and an output is supplied on lead 48 indicating whether the subtraction is positive or negative. Similarly, the contents of registers 43 and 44 are compared or subtracted in comparison circuit 50, and an output is supplied on lead 52 indicating the sign of the subtraction. Comparison circuit 54 then provides an output on lead 56 if the signs indicated on outputs 48 and 52 are different.

Considering operation of this portion of the circuitry, if the output of ADC 12′ is continuously changing in a given direction, then the output on leads 48 and 52 will be the same inasmuch as the sign of the subtraction between the contents of register 44 and 43 and the sign of the subtraction of the contents of registers 43 and 42 will be the same. However, if the output of ADC 12′ changes in direction, then the outputs on leads 48 and 52 will be different.

The output of comparison circuit 54, indicating the signs of comparison on leads 48 and 52 are different, is connected to memory 58 via led 56 for causing the output of ADC 12′ to be loaded into memory 58. Therefore, memory 58 will store the identification of the last "step" which represents a reversal in the output of ADC 12′.

The identification of the last reversal step from memory 58 is subtracted from the current output from ADC 12′ in subtractor 60. The input steps from ADC 12′ are numbered consecutively and therefore the output of subtractor 60 corresponds to the interval since the last reversal. Each time a reversal takes place, memory 58 is located as indicated above. The output of subtractor 60 is tested in threshold circuit 62 in order to determine whether the result of the subtraction exceeds the "doubling interval" i.e. whether the value of the subtraction exceeds ten steps in the given example. Threshold circuit 62 also detects whether the output of subtractor 60 exceeds twice the doubling interval, three times the doubling interval etc. and provides a corresponding output of one, if the doubling interval is not exceeded, an output of two if the doubling interval is exceeded once but not twice, an output of four if the doubling interval is exceeded three times, but not four times, etc. Threshold circuit 62 suitably comprises a plurality of gates for detecting each time the result of the subtraction increases by ten, or may comprise a decimal register wherein the tens digit is tested. Alternatively, the doubling interval may comprise a power of two (or any other value for that matter) whereby a binary register may be employed.

The output of the circuit is provided via digital to analog converter 16' from up-down counter 64. The up-down counter 64 is operated in response to each step change in the output of ADC 12', as tested in comparison circuit 46 both with respect to the presence of a step and the sign thereof. That is, if the output of comparison circuit 46 for a given change in the output of ADC 12' is positive, then up-down counter 64 will be counted in a first direction. If the output of ADC 12' changes in the opposite direction, the comparison circuit 46 will produce an output that is opposite in sign, and count the up-down counter 64 one step in a reverse direction. However, the comparison circuit 46 is coupled to the up-down counter by way of multiplier 66 so that the step indication from comparison circuit 46 will be multiplied by one, two, four, eight, or sixteen, depending upon how many steps have taken place since the last reversal as determined by subtraction circuit 60. The sign of the change is delivered directly to up-down counter 64 as indicated by the connection 68. Therefore, an output from up-down counter 64 is a count having the desired variable relation to the step output indication of ADC 12'.

The circuit of FIG. 4 and the operation thereof as thus far described is appropriate for a continuous control device 10', or one not having end stops proximate which the control is advanced. For a system wherein the "end stop position" of DAC 16' is to coincide with the end stop position of control device 10', then additional circuitry is utilized for detecting when end stops of control device 10' are approached. As in the case of the previous embodiment, if a maximum pre-selected step size multiplied by the range left for the ADC is less than the DAC limit approached minus the present DAC value, then a new DAC value is set such that the maximum step size multiplied by the range left for the ADC is equal to the DAC limit approached minus the newly set DAC value. In particular, a value detector 7 in FIG. 4 detects increments of the ADC output away from the limits of zero and 256 in the present example. For instance all levels from zero through 128 are detected as such, and all levels from 129 through 256 are subtracted from 256. The result is multiplied, in value detector 70, by the maximum step size equaling 32 in the present example. A second value detector 72 detects the number of steps away from the end limits of DAC 16'. In particular, all levels from zero through 2,048 are detected as such and all levels from 2,048 to 4,096 are subtracted from 4,096. The outputs of value detectors 70 and 72 are compared in comparison circuit 74 to determine if the output of value detector 70 is less than the output of value detector 72. If it is less, and if at the same time the ADC 12' is continuing to approach a given end stop as determined by the output of comparison circuit 46 on lead 76, then the comparison circuit 74 provides a control output on lead 78 for forcing up-down counter 64 to a new value equaling the DAC limit approached minus the maximum step size (32 in the example) multiplied by the range left on the ADC 12'. Comparison circuit 74 is implemented as a subtractor for comparing the outputs of detector 70 and 72, and a second subtractor controlled by the output on lead 76 for providing the difference between the output of detector 70 (comprising maximum step size multiplied by the range left on the ADC) and either 4,096 or zero, depending on which limit is approached. The result of the last subtraction is supplied via lead 78 for forcing up-down counter 64.

There follows a program listing, in a pseudo-code, similar to the Pascal language, for operating the processor 14 in FIG. 1, this program corresponding in function to the procedure outline by the flow charts illustrated in FIG. 3a and 3b, and described in connection therewith.

```
Procedure: Variable Resolution get_present_adc_value(present_adc_value)

last_adc_value=present-adc-value repeat while (last_adc_value=present_adc_value) do
        get_present_adc_value(present_adc_value)
    endwhile if (present_adc_value>last_adc_value) then if (last_reversal_direction<>increasing) then last_reversal_direction=increasing
            distance_from_reversal_point=0
        endif remaining_adc_range=
            (positive_adc_endpoint-present_adc_value)*max_dac_increment remaining_dac_range=positive_dac_endpoint-dac_value
```

```
        if (remaining_dac_range>remaining_adc_range) then
            dac_value=positive_dac_endpoint-remaining_adc_range
        else
            compute_new_dac_value(present_adc_value,last_adc_value,dac_value,
                        distance_from_reversal)
        endif
    else
        if (last_reversal_direction=increasing) then last_reversal_direction=decreasing
            distance_from_reversal_point=0
        endif remaining_adc_range=
            (present_adc_value-negative_adc_endpoint)*max_dac_increment remaining_dac_range=dac_value-negative_dac_endpoint if (remaining_dac_range>remaining_adc_range) then
            dac_value=remaining_adc_range-negative_dac_endpoint
        else
            compute_new_dac_value(present_adc_value,last_adc_value,dac_value,
                        distance_from_reversal)
        endif
    endif last_adc_value=present_adc_value
    output_dac_value_to_digital_to_analog_converter(dac_value)
until (forever)
endrepeat
Subroutine: compute_new_dac_value(present_adc_value,last_adc_value,dac_value,
                                            distance_from_reversal)

distance_from_reversal=
    distance_from_reversal+absolute_value(present_adc_value-last_adc_value)

temp_distance=distance_from_reversal-doubling_interval
dac_increment_size=1 while (temp_distance>0) and (dac_increment_size<max_dac_increment) do dac_increment_size=dac_increment_size*2
    temp_distance=temp_distance-doubling_interval endwhile dac_value=dac_value+(present_adc_value-last_adc_value)*dac_increment_size if (dac_value>max_allowed_dac_value) then dac_value=max_allowed_dac_value endif
```

```
if (dac_value<min_allowed_dac_value) then dac_value=min_allowed_dac_value endif return
```

Data Dictionary for Variable Resolution Procedure

--- dac_increment_size: temporary variable used to calculate
    the digital to analog converter input- holds value that the
    input is to be incremented for each control device increment dac_value: present value of the digital to analog converter input distance_from_reversal: number of input increments the control device
    has moved since the last reversal doubling_interval: contains number of analog to digital converter
    increments for which the digital to analog converter
    increment size is to double last_adc_value: value containing the result of the previous
    analog to digital conversion last_reversal_direction: direction control device was moving after last
    reversal in direction max_dac_increment: maximum amount the digital to analog
    converter output is allowed to change for a change of one in the
    analog to digital converter output negative_adc_endpoint: smallest value the analog to digital converter output
    is allowed to take on negative_dac_endpoint: smallest value the digital to analog converter
    can accept and still have a valid output positive_adc_endpoint: largest value the analog to digital converter
    output is allowed to take on positive_dac_endpoint: largest value the digital to analog converter
    can accept and still have a valid output level present_adc_value: a value representing the latest analog to
    digitial conversion providing a digital representation of
    the current position of the controlling device remaining_adc_range: value containing the maximum amount of
    the digital to analog converter range that could be covered
    by the remaining range of the analog to digital converter
    multiplied by max_dac_increment remaining_dac_range: value containing the distance from the
    present digital to analog converter input to the endpoint
    in the direction of movement indicated by the control device temp_distance: temporary variable used to calculate the final
    value of the digital to analog converter input While we have shown and described plural embodiments of our invention, it will be apparent to those skilled in the art that many changes and modifications may be made without departing from our invention in its broader aspects. We therefore intend the appended claims to cover all such changes and modifications as fall within the true spirit and scope of our invention.

We claim:

1. A variable resolution control system in which a variable analog input, having a given range of bi-directional amplitude adjustment, is converted into an analog output having an effectively larger range of adjustment, comprising:
   means for detecting a reversal in the direction of increase or decrease of the amplitude of said variable analog input;
   means for changing said analog output in proportion to said analog input over a first range of change of the amplitude of said analog input in a given direction following detection of a reversal; and
   means for detecting an interval of change since said detected reversal for causing said means for changing said analog output to increase the proportionality factor between said output and input for successive ranges of change of said input in said given direction.

2. The control system according to claim 1 further including means for detecting when said analog input approaches an end of said given range of adjustment such that any remaining adjustment in said first range is insufficient to cover the remainder of said larger range; and
   means for incrementing said output in a direction for reducing said remainder of said larger range.

3. A method of converting a variable input adjustable in increasing and decreasing directions over a first range of amplitude into an output adjustable in increasing and decreasing directions over a proportionately larger range of amplitude, comprising:
   changing said output in a first one of said increasing and decreasing directions in response to a change in said input in a first one of said increasing and decreasing directions, including increasing the proportionality of amplitude between said output and input as said input continues to change in said first direction;
   detecting a reversal in the direction of said input; and
   changing said output in a second direction in response to a change in said input in a second direction after a detected reversal, wherein said proportionality of amplitude between said output and input is reduced in response to a detected reversal, and then said proportionality of amplitude between said output and input is increased as said input continues to change in said second direction.

4. The method according to claim 3 wherein adjustment of said variable input over said first range of amplitude is substantially continuous.

5. The method according to claim 3 wherein adjustment of said variable input over said first range of amplitude is limited, and further including detecting when any remaining adjustment in said first range of amplitude is insufficient to cover any remainder of said larger range of amplitude, and incrementing said output in a direction for reducing said remainder of said larger range.

6. The method according to claim 3 wherein adjustment of said variable input over said first range of amplitude is limited, and further including detecting when any remaining adjustment in said first range of amplitude multiplied by a proportionality factor is less than any remaining adjustment in said larger range, and setting said output so that said remaining adjustment in said first range multiplied by said proportionality factor equals the remaining adjustment in said larger range.

7. A method of converting a variable analog input having a range of amplitude adjustment in both an increasing and decreasing direction into an analog output having an effectively larger range of adjustment, comprising:
   monitoring the direction of said variable analog input and detecting a reversal of the direction if one occurs;
   changing the amplitude of said analog output in proportion to the amplitude of said analog input over a first range of change of the amplitude of said analog input in a given direction after a detected reversal; and
   increasing the proportionality of amplitude between said analog output and analog input as said analog input increases in said given direction within a second range of amplitude beyond said first range.

8. The method according to claim 7 including further increasing said proportionality in at least a third and subsequent range as said analog input continues to increase in said given direction.

9. A method of converting a variable analog input, having a given range of amplitude adjustment in both increasing and decreasing directions, into an output having an effectively larger range of adjustment in the same direction as said input, comprising:
   converting said analog input into a digital input which tracks said analog input in said increasing and decreasing directions;
   detecting a reversal in the direction of said digital input;
   changing said output in a first direction in response to a change in said digital input in a first direction, including progressively increasing the proportionality between said output and input by larger factors as said input continues to change in said first direction if no reversal is detected; and
   changing said output in a second direction in response to a change in said digital input in a second direction after detected reversal, including reducing the proportionality between said output and input when a reversal is detected, and then progressively increasing the proportionality between said output and input as said input continues to change in said second direction.

10. The method according to claim 9 including providing said output as a digital value and converting said last mentioned digital value to an analog control value.

11. The method according to claim 9 wherein said given range is limited, and further including detecting when the remaining adjustment in said given range multiplied by a proportionality factor is less than the remaining adjustment in said larger range, and setting said output so that said remaining adjustment in said given range multiplied by said proportionality factor equals the remaining adjustment in said larger range.

* * * * *